(12) United States Patent
Kehrer et al.

(10) Patent No.: US 8,749,056 B2
(45) Date of Patent: Jun. 10, 2014

(54) MODULE AND METHOD OF MANUFACTURING A MODULE

(75) Inventors: Daniel Kehrer, Sauerlach (DE); Stefan Martens, Munich (DE); Tze Yang Hin, Penang (MY); Helmut Wietschorke, Laberweinting (DE); Horst Theuss, Wenzenbach (DE); Beng Keh See, Melaka (MY); Ulrich Krumbein, Rosenheim (DE)

(73) Assignee: Infineon Technologies AG, Neubiberg (DE)

( * ) Notice: Subject to any disclaimer, the term of this patent is extended or adjusted under 35 U.S.C. 154(b) by 241 days.

(21) Appl. No.: 13/116,285

(22) Filed: May 26, 2011

(65) Prior Publication Data

US 2012/0299170 A1     Nov. 29, 2012

(51) Int. Cl.
*H01L 23/34*     (2006.01)
(52) U.S. Cl.
USPC ........... 257/728; 257/685; 257/686; 257/737; 257/738; 257/741; 257/777; 257/778; 257/784; 257/787; 257/E23.116; 257/E25.013; 257/E25.018; 257/E25.027; 438/50; 438/55; 438/56; 438/64; 438/74; 438/106; 438/108; 438/112; 438/124; 438/126

(58) Field of Classification Search
USPC ......... 257/682, 685–687, 728, 737, 738, 741, 257/777, 778, 784, 787, E23.116, E23.124, 257/E25.013, E25.018, E25.027; 438/50, 438/55, 56, 64, 74, 106, 108, 112, 124, 126, 438/127
See application file for complete search history.

(56) References Cited

U.S. PATENT DOCUMENTS

| 7,288,435 B2 | 10/2007 | Aigner et al. |
| 2005/0121413 A1 | 6/2005 | Weekamp |
| 2007/0080757 A1* | 4/2007 | Yahata et al. ................. 333/133 |
| 2011/0042798 A1* | 2/2011 | Pagaila et al. ................. 257/692 |

FOREIGN PATENT DOCUMENTS

KR     100698570 B1     3/2007

OTHER PUBLICATIONS

Daeche, F., et al., "An Environmentally Friendly, Low Cost, Leadless Package Concept for RF-MEMS," 36th International Symposium on Microelectronics and Packaging Society, Nov. 18-20, 2003, pp. 207-215, Boston MA.
Goetz, M. P., "Modular Integration of RF SAW Filters," IEEE Ultrasonics Symposium, Aug. 23-27, 2004, pp. 1090-1093, vol. 2.
Franosch, M., et al., "Wafer-Level-Package for Bulk Acoustic Wave (BAW) Filters," IEEE MTT-S International Microwave Symposium Digest, Jun. 6-11, 2004, pp. 493-496, vol. 2.

* cited by examiner

*Primary Examiner* — Meiya Li
(74) *Attorney, Agent, or Firm* — Slater & Matsil, L.L.P.

(57) ABSTRACT

A module and a method for manufacturing a module are disclosed. An embodiment of a module includes a first semiconductor device, a frame arranged on the first semiconductor device, the frame including a cavity, and a second semiconductor device arranged on the frame wherein the second semiconductor device seals the cavity.

23 Claims, 4 Drawing Sheets

US 8,749,056 B2

MODULE AND METHOD OF MANUFACTURING A MODULE

TECHNICAL FIELD

The present invention relates generally to a module and a method for manufacturing a module.

BACKGROUND

Electronic component packaging generally is the final stage of semiconductor device fabrication. The electronic components may be incorporated into an individual protective package, mounted with other components in hybrid or multi-component modules or connected directly onto a printed circuit board (PCB).

SUMMARY OF THE INVENTION

In accordance with an embodiment of the present invention, a module comprises a first semiconductor device, a frame arranged on the first semiconductor device, the frame comprising a cavity, and a second semiconductor device arranged on the frame wherein the second semiconductor device seals the cavity.

In accordance with an embodiment of the present invention, a method for manufacturing comprises attaching a frame to a radio frequency (RF) filter, the frame comprising a cavity, and sealing the cavity by attaching a semiconductor device to the frame.

In accordance with an embodiment of the present invention, a module comprises a first semiconductor device bump-bonded to a support substrate and a second semiconductor device bump-bonded to the support substrate. The module further comprises a frame comprising a cavity arranged between the first semiconductor device and the second semiconductor device.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a radio frequency module. The invention may also be applied, however, to other modules.

Figure 1A:
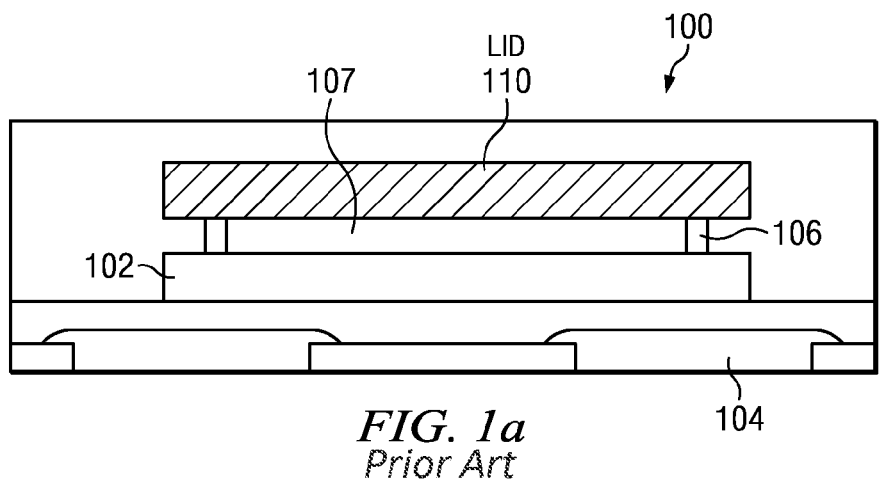
FIGS. 1a-1c show a cross sectional view and top views of a conventional radio frequency (RF) filter stand alone device.
Figure 1B:
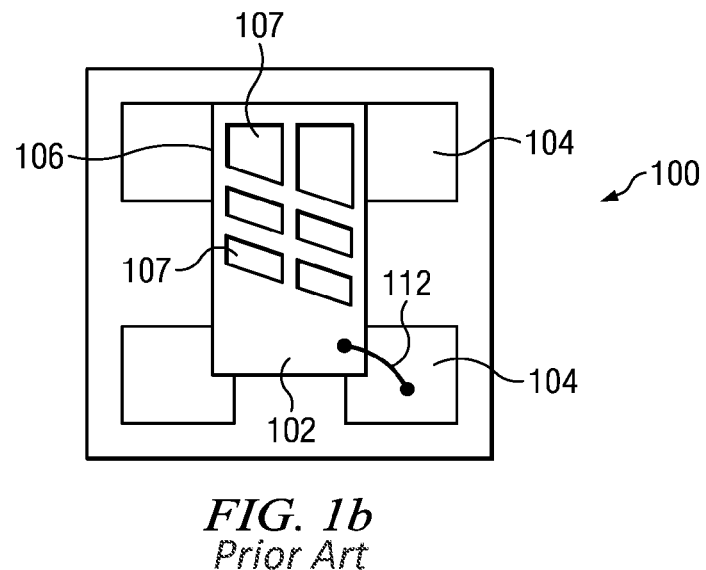
Figure 1C:
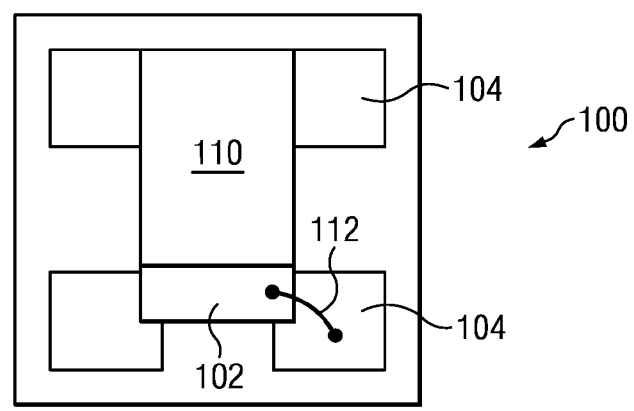

FIGS. 1a-1c show a conventional radio frequency (RF) filter stand alone device 100. The RF filter 102 is arranged on a leadframe 104. The RF filter 102 includes a frame 106 with cavities 107 arranged on the RF filter 102. The cavities 107 are covered with a lid 110. The lid 110 may be a mechanically stiff material such as a semiconductive material or a metal. The RF filter 102 is electrically connected to the leadframe 104 via wirebonds 112.

Figure 2A:
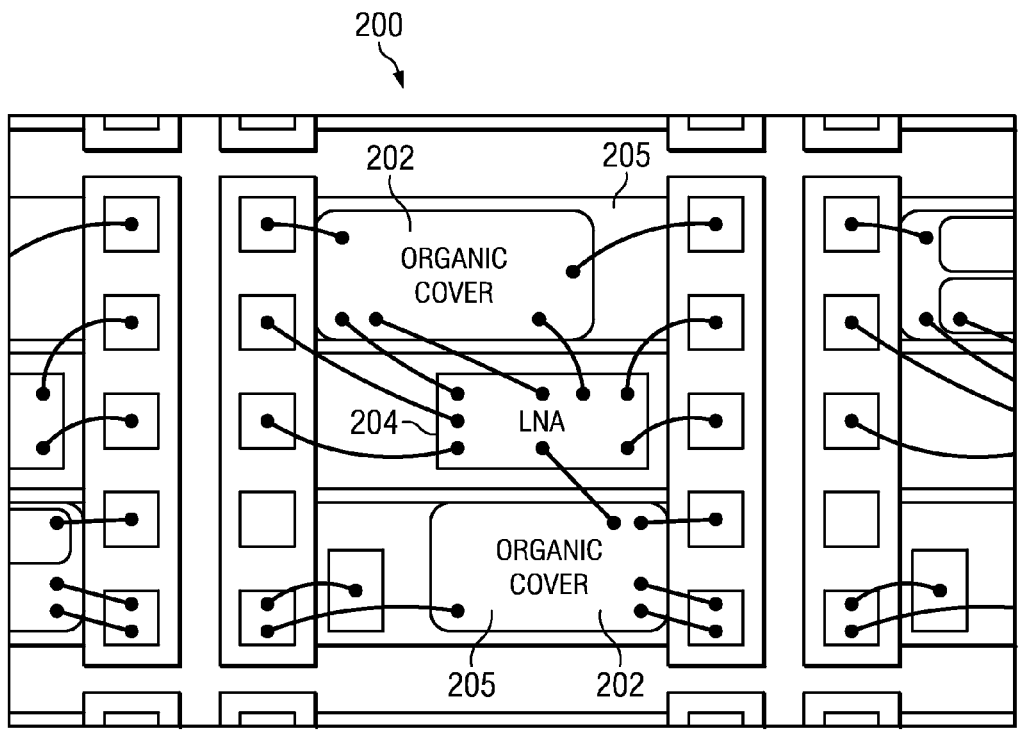
FIGS. 2a-2b show top views of a conventional radio frequency (RF) module.
Figure 2B:
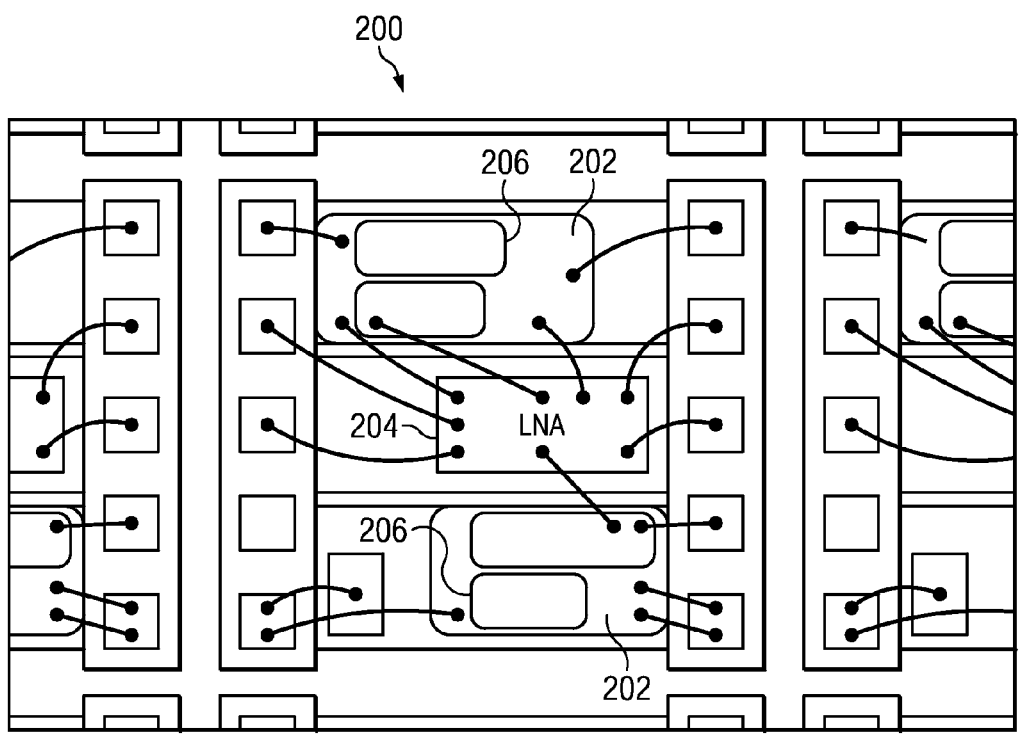

FIGS. 2a and 2b show a top view of a conventional radio frequency (RF) module 200. The RF module 200 comprises two SAW filters 202 and a low noise amplifier (LNA) 204 on a thin small non lead package (TSNP) leadframe before a lid 206 assembly (FIG. 2a) and after the placement of the lids 206 (FIG. 2b). The RF filters 202 and the LNA 204 are arranged side by side on the TSNP leadframe. A frame including an organic cover 205 is arranged on each SAW filter 202. A lid 206 is placed on each of the organic covers 205. The radio frequency (RF) module 200 comprises a large leadframe area because of its side-by-side arrangement of the LNA 204 and the SAW filters 202.

Embodiments of the present invention provide modules including a semiconductor device arranged over an RF filter. Further embodiments may provide a short electrical connection between the semiconductor device and the RF filter by directly connecting the first semiconductor device to the RF filter.

An advantage of an embodiment of the present invention is to save board space, module footprint or package size. The size of the module can be substantially reduced while the height of the module is not or only marginally increased. A further advantage is that the semiconductor device may increase the mechanical stability of the frame/protective cavity. The semiconductor device may have stiffer material properties than a conventional lid. Yet another advantage may be provided by short wire distances between the RF filter and the semiconductor device. For example, shorter wire length may be less susceptible to cross-talk, provide more controllable impedance, be less susceptible to electro-magnetic interference (EMI), generate less EMI, and/or introduce less delay into transmitted signals.

Radio frequency filters such as surface acoustic wave (SAW) filters, bulk acoustic wave (BAW) filters or film bulk acoustic resonators (FBAR) filters need packages with resonator cavities. These resonator cavities allow a free surface above the acoustically active regions. At the same time, the frame material that defines the cavity may be compatible with the semiconductor fabrication environment. Typically the cavities in the packages may be sealed by a metal, ceramic or silicon lid.

Figure 3A:
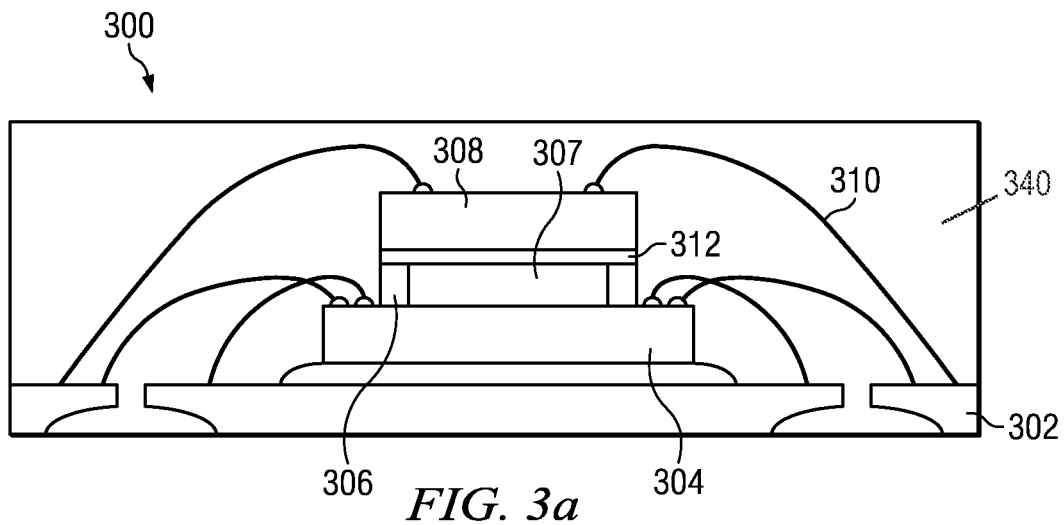
FIGS. 3a-3e show cross sectional views of embodiments of a radio frequency (RF) module.

FIG. 3a shows a cross sectional view of a first embodiment of a module 300. The module 300 comprises a support substrate 302, a first semiconductor device 304, a frame 306 including a cavity 307 and a second semiconductor device 308. The first semiconductor device 304 and the second semiconductor device 308 may be electrically connected to the support substrate 302 with wires 310.

The support substrate 302 may be a leadframe, a glass core based substrate, or a printed circuit board (PCB), for example. The support substrate 302 may comprise a conductive material such as nickel (Ni) or copper (Cu). The support substrate 302 may be plated with silver (Ag) or gold (Au) in some embodiments or may be plated with a metal layer stack such as palladium/gold (Pd/Au) in other embodiments. Alternatively, the support substrate 302 may be a glass carrier or a PCB board comprising of prepreg core substrate with fiber glass and epoxy resin. The support substrate 302 may comprise metalized contact pads from the conductive material described above or from another conductive material such as Nickel (Ni) or aluminum (Al).

The first semiconductor device 304 may be a radio frequency (RF) device such as a surface acoustic wave (SAW) filter, a bulk acoustic wave (BAW) filter or a film bulk acoustic resonators (FBAR) filter. Alternatively, the first semiconductor device 304 may be other filters, resonators, oscillators, transformers, sensors, or devices having a region which needs to be protected. The first semiconductor device 304 may comprise a plurality of filters and/or other devices. For example, the first semiconductor device 304 may comprise two or more SAW filters or two or more BAW filters. Alternatively, the first semiconductor device 304 may comprise two or more different type of devices such as a BAW filter and a SAW filter or a sensor and a filter.

The first semiconductor device 304 may be configured to receive signals, to filter signals, to transform signals or to provide signals. For example, the semiconductor device 304 may be configured to pass frequencies of a signal in a specific range, to pass high frequencies of a signal or to pass low frequencies of a signal.

SAW devices generally are fabricated on piezoelectric and/or pyroelectric substrates. The SAW devices are used to convert acoustic waves to electrical signals and vice versa by exploiting the piezoelectric effect of materials such as quartz, lithium niobate, lithium tantalate, lanthanum gallium silicate, for example. SAW devices typically operate in a frequency range up to about 3 GHz.

BAW devices generally are fabricated on a silicon substrate. BAW devices may implement half-ladder, full-ladder, lattice or stacked topology resonators. For example, a BAW device may be formed from a network of resonators. The device may be designed to remove unwanted frequencies from being transmitted, while allowing other specific frequencies to be received and transmitted. BAW filters typically operate at frequencies from around 2 GHz to around 16 GHz, and may be smaller or thinner than equivalent SAW filters.

FBAR devices generally may comprise a piezoelectric material sandwiched between two electrodes and acoustically isolated from a surrounding medium. FBAR devices may be manufactured from piezoelectric films with thicknesses ranging from several micrometers down to tenth of micrometers. The devices may resonate in the frequency range of roughly about 100 MHz to about 10 GHz. Aluminum nitride and Zinc oxide are two common piezoelectric materials used in FBARs.

The first semiconductor device 304 comprises a region on a surface which should be protected. For example, a region such as an active area of the device circuitry or a resonator of the SAWs, BAWs or FBARs should not be touched because this would damp the acoustic waves or would change the operation frequencies of the filters. A frame 306 with a protective cavity 307 over the region may provide the protection. For example, the frame 306 may encircle the region. The frame 306/protective cavity 307 protects the region from contamination (e.g. particles), mechanical damage (e.g. scratching), environmental influences (e.g. humidity) or clamping. The protective cavity 307 may be one large cavity or a may be a plurality of small cavities. For example, the first semiconductor device 304 may comprises two filters and may comprise one large protective cavity or may comprise two smaller cavities.

The frame 306 may be made from an organic material such as an epoxy resin, polyimide, SU-8™ manufactured by MicroChem, or other polymers. Alternative, the frame 306 may be made from ceramic or a metal. In one example, the frame 306 completely encapsulates the protective cavity 307. In another an example, the top surface of the protective cavity 307 is not covered or is only partially covered by the frame 306. The protective cavity 307 may be rectangular, oval or circular, for example.

The second semiconductor device 308 may be located on top of the frame 306 and may cover the protective cavity 307. In one embodiment the protective cavity 307 may be hermetically sealed. The frame 306 and/or the second semiconductor device 308 may protect and seal the protective cavity 307 from the molding flow. It is noted that the frame 306 of the protective cavity 307 may collapse due to high molding pressure if the second semiconductor device 308 is not located on the top of the frame 306. In another embodiment the protective cavity 307 is sealed but not hermetically sealed.

The second semiconductor device 308 may be attached to the frame using a die attach foil 312, a layer of epoxy adhesive 312, an insulating polyimide 312, or the like.

The second semiconductor device 308 may be a discrete or stand alone device or an integrated circuit. For example, the second semiconductor device 308 may be a power amplifier, a low noise amplifier (LNA) or a switch. Alternatively, the second semiconductor device 308 may comprise a combination of these devices and/or transistors or capacitors.

The second semiconductor device 308 may be configured to process signals, to amplify signals, to switch signals or to transmit signals. For example, the semiconductor device 308 may be configured to amplify signals in a specific frequency range, to amplify signals having high frequencies or to amplify signals having low frequencies.

The first semiconductor device 304 may be die-bonded to the support substrate 302. In one embodiment the connection between the first semiconductor device 304 and the support substrate 302 may be a non-conducting bond. For example, the non conductive bond may be formed by using an epoxy adhesive or an insulating polyimide. Alternatively, the first semiconductor device 304 is attached to the support substrate 302 using a die attach foil. In one embodiment the connection between the first semiconductive device 304 and the support substrate 302 may be a conductive bond. The conductive bond may be formed by using a gold/tin eutectic, a copper/tin metal layer, a metal filled epoxy or a conductive polyimide.

The second semiconductor device 308 may be attached to the frame 306. For example, the second semiconductor device 308 may be die-bonded to the frame 306 so that the cavity 307 is sealed. The second semiconductor device 308 may be connected to the frame 306 via a non conducting bond such as a die attach foil, an epoxy adhesive or an insulating polyimide.

The first semiconductor device 304 and the second semiconductor device 308 may then be wire-bonded to the support substrate 302 using wires 310. The wire 310 may be bonded to the support substrate 302 directly or to bonding pads arranged on a top surface of the support substrate 302. The wire 310 may first bonded to a bonding pad of the first semiconductor device 304, then spanned to the support substrate 302 and then clipped. Alternatively, the wire 310 may be bonded to the support substrate 302 or bonding pads by forming a ball at the end of the wire. The end of the wire 310 is ultrasonically pressed under a temperature budget to the support substrate 302 or bonding pads. This process is repeated for all bonding pads of the first semiconductor device 304 and for all bonding pads of the second semiconductor device 308. Suitable materials for wire-bonding may be copper (Cu), gold (Au) or aluminum (Al).

Figure 3B:
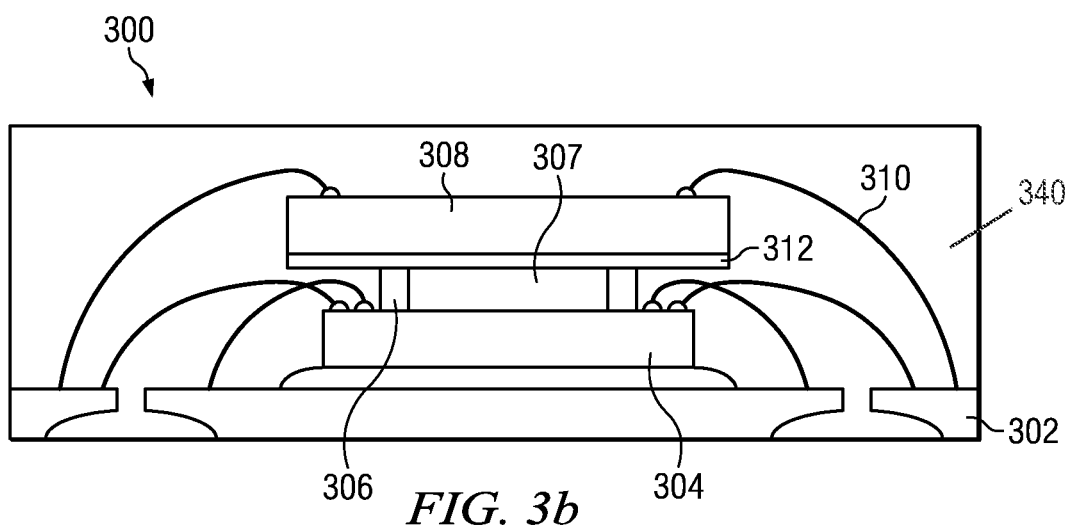

In one embodiment the first semiconductor device 304 may be bonded to the support substrate 302 before the second semiconductor device 308 is attached to the frame 306 of the first semiconductor device 304. This is shown in FIG. 3b. The second semiconductor device 308 may be the same size as or larger than the first semiconductor device 304. The second semiconductor device 308 is attached to the frame 306 after the wire-bonding of the first semiconductor device 304 is performed. After attaching the second semiconductor device 308, the device 308 is only then wire-bonded to the support substrate 302.

Figure 3C:
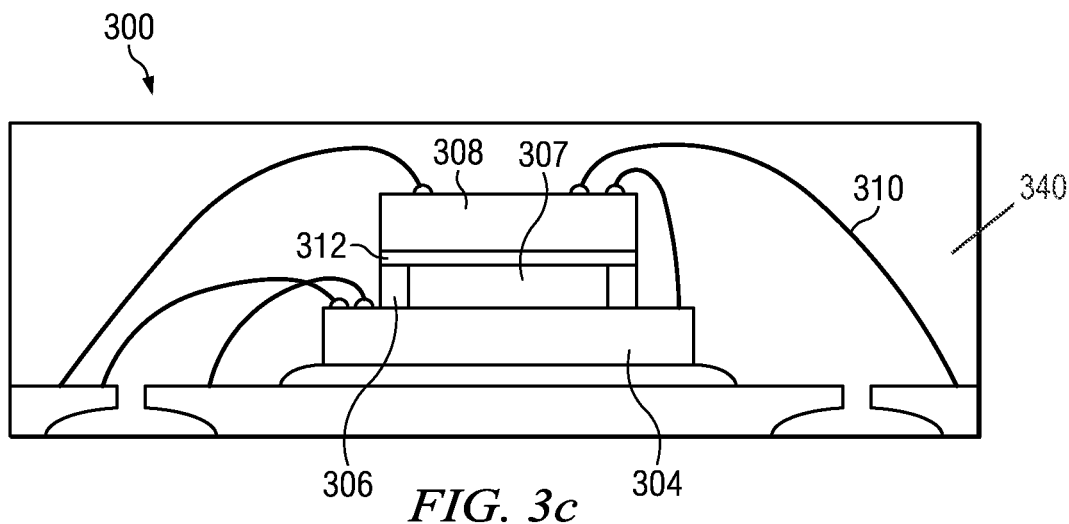

FIG. 3c shows an embodiment of the module 300 where the second semiconductor device 308 is directly bonded to the first semiconductor device 304. For example, the wire 310 is bonded from a first bonding pad of the first semiconductor device 304 to a second bonding pad of a second semiconductor device 308. In radio frequency applications, shorter electrical wires distances between two semiconductor devices 304, 308 may provide improved or superior performance of the module.

Moreover, as can be seen from FIG. 3c, the second semiconductor device 308 is placed on a frame 306 completely encapsulating the protective cavity 307. In all embodiments the frame 306 may or may not completely encapsulate the protective cavity 307.

The module 300 may be packaged using a molding compound 340 such as a resin or a plastic. For example, the casting material may package the first semiconductor device 304, the second semiconductor device 308, the frame 306 and at least a portion of the support substrate 302, e.g., a leadframe, a glass core based substrate, or a printed circuit board (PCB).

Figure 3D:
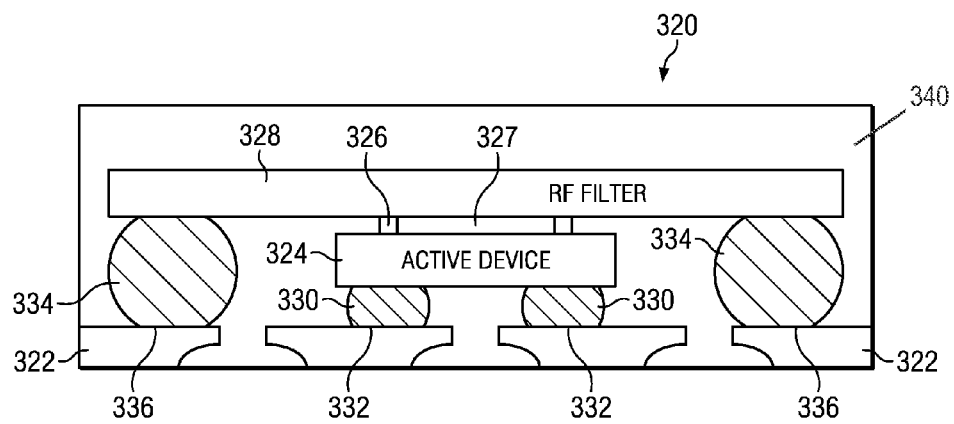
Figure 3E:
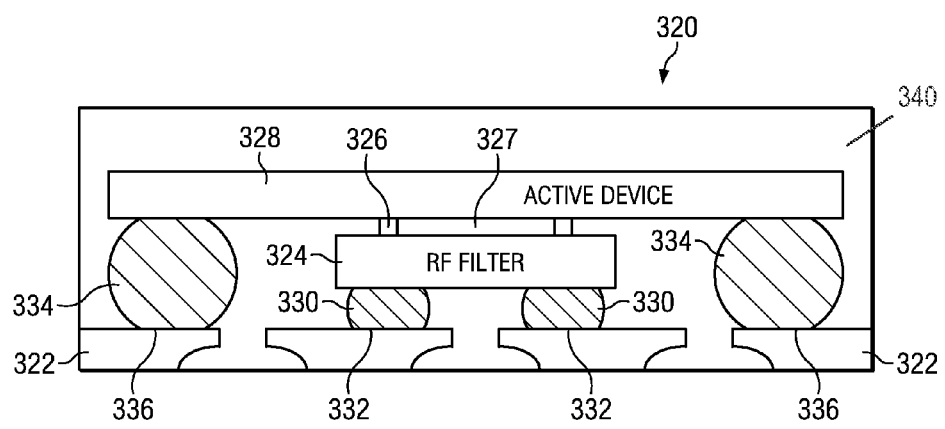

FIGS. 3d and 3e show further embodiments of a module 320. A first semiconductor device 324 and a second semiconductor device 328 may be soldered to a support substrate 322. In FIG. 3d the smaller first semiconductor device 324 may be a stand alone device or an integrated circuit as described above with respect to FIG. 3a. The larger second semiconductor device 328 may be a filter (SAW, BAW, FBAR), resonator, oscillator, transformer, sensor, a device having a region which should be protected, or combinations thereof.

In contrast, in FIG. 3e the smaller first semiconductor device 324 may be a filter (SAW, BAW, FBAR), a resonator, oscillator, a transformer, a sensor, a device having a region which needs to be protected, or combination thereof. The larger second semiconductor device 328 may be the stand alone device or the integrated circuit.

The first semiconductor device 324 may be soldered to the support substrate 322 using a flip-chip technology. Solder bumps or pillar bumps 330 are used to electrically connect the first semiconductor device 324 to the support substrate 322. In one embodiment the reflowable solder bumps 330 may comprise metals such as tin (Sn), lead (Pb), antimony (Sb), bismuth (Bi), silver (Ag), copper (Cu) or combinations thereof. Alternatively, the reflowable solder consists essentially of tin (Sn) or silver/tin (SnAg). In one embodiment the pillar bumps 330 may comprise copper (Cu) with a solder top comprising the material of the reflowable solder bump.

The solder bumps or pillar bumps 330 are placed or formed on the first semiconductor device 324. The first semiconductor device 324 is then flipped and the bumps 330 are brought in contact with the contact pads 332 of the support substrate 322. Flux may or may not be applied. The first semiconductor device 324 and the support substrate 322 is put in the reflow oven where the arrangement is heated above a melting temperature and the bumps or the tops of the bumps melt to form contacts. Alternatively, contacts may be formed by pressing the pillar bumps 330 on heated contact pads 332 of the support substrate 322. The solder tops of the pillar bumps melt and form alloys with the pillar material and the support substrate 322/contact pad 332 material.

In one embodiment the alloys of the contacts may be a binary tin/silver (Sn/Ag) alloy layer formed over the contact pads 332 and a binary copper/tin (Cu/Sn) alloy layer formed below or around the tip of the pillar bump above the binary tin/silver (Sn/Ag) alloy layer. A ternary a copper/tin/silver (Cu/Sn/Ag) alloy layer may be formed between the binary tin/silver (Sn/Ag) alloy layer and the binary copper/tin (Cu/Sn) alloy layer.

In another embodiment the alloys of the contacts may be a binary tin/gold (Sn/Au) alloy layer formed above the contact pads 332 and a binary copper/tin (Cu/Sn) alloy layer formed below or around the tip of the pillar bump above the binary tin/gold (Sn/Au) alloy layer. In one embodiment a ternary a copper/tin/gold (Cu/Sn/Au) alloy layer may be formed between the binary tin/gold (Sn/Au) alloy layer and the binary copper/tin (Cu/Sn) alloy layer.

In yet another embodiment the alloys of the contacts may be two binary copper/tin (Cu/Sn) alloy layers.

A frame 326 comprising the protective cavity 327 is formed on the first semiconductor device 324 if the first semiconductor device 324 is the RF filter and is formed on the second semiconductor device 328 if the second semiconductor device 328 is the RF filter. The frame 326 may or may not completely encapsulate the protective cavity 327. A die attach foil may be used to connect the first semiconductor device 324 or the second semiconductor device 328 to the frame 326.

The second semiconductor device 328 may then be soldered to the support substrate 322 using a flip-chip technology. Solder bumps or pillar bumps 334 are used to electrically connect the second semiconductor device 328 to the contact pads 336 of the support substrate 322. The contacts formed between the second semiconductor device 328 and the contact pads 336 may be the same as between the first semiconductor device 324 and the contact pads 332 or may be different. For example, the first contacts and the second contacts may be both solder bumps, both pillar bumps, or a combination of pillar bumps and solder bumps.

The second semiconductor device 328 may seal the protective cavity 327. The seal may or may not a hermetic seal. In one embodiment an attracting force of the liquid solder may pull down the second semiconductor device 328 pressing the second semiconductor device 328 on the frame 326 sealing the protective cavity 327.

The module 320 may be finally packaged using a molding compound 340 such as a resin or a plastic. For example, the casting material may package the first semiconductor device 324, the second semiconductor device 328, the frame 326 and at least a portion of the support substrate 322, e.g., a leadframe, a glass core based substrate, or a printed circuit board (PCB). It is noted that the first semiconductor device 324 and the second semiconductor device 328 can be soldered to the support substrate 322 at the same time or at different times.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A module comprising:
   a first semiconductor device;
   a frame arranged on the first semiconductor device, the frame comprising a cavity;
   a second semiconductor device, wherein the second semiconductor device is arranged on the frame, and wherein the second semiconductor device seals the cavity; and
   a support substrate, wherein the first semiconductor device is soldered to the support substrate, and wherein the second semiconductor device is soldered to the support substrate.

2. The module according to claim 1, wherein the first semiconductor device is a radio frequency (RF) filter.

3. The module according to claim 1, wherein the first semiconductor device is selected from the group consisting of: a surface acoustic wave (SAW) filter, a bulk acoustic wave (BAW) filter and a film bulk acoustic resonator (FBAR) filter.

4. The module according to claim 1, wherein the second semiconductor device comprises a power amplifier, a low noise amplifier (LNA), or a switch.

5. The module according to claim 1, wherein the second semiconductor device is configured to receive a radio frequency (RF) signal from the first semiconductor device.

6. The module according to claim 1, wherein the frame comprises an organic material.

7. The module according to claim 1, further comprising a molding compound, wherein the molding compound encapsulates the first semiconductor device, the frame and the second semiconductor device.

8. The module according to claim 1, wherein the frame comprises a ceramic.

9. The module according to claim 1, wherein the frame comprises a metal.

10. The module according to claim 1, wherein the cavity is hermetically sealed.

11. The module according to claim 1, wherein the first semiconductor device is smaller than the second semiconductor device.

12. A module comprising:
    a first semiconductor device comprising first bonding pads, the first bonding pads being soldered to a support substrate;
    a second semiconductor device comprising second bonding pads, the second bonding pads being soldered to the support substrate; and
    a frame comprising a cavity arranged between the first semiconductor device and the second semiconductor device.

13. The module according to claim 12, wherein the first semiconductor device comprises a RF filter, and the second semiconductor device comprises a power amplifier.

14. The module according to claim 12, further comprising a molding material encapsulating the first semiconductor device, the frame and the second semiconductor device.

15. The module according to claim 12, wherein the first semiconductor device comprises a RF filter, and the second semiconductor device comprises a low noise amplifier (LNA).

16. The module according to claim 12, wherein the first semiconductor device comprises a RF filter, and the second semiconductor device comprises a switch.

17. The module according to claim 12, wherein the first semiconductor device is smaller than the second semiconductor device.

18. A module comprising:
    a support substrate comprising first support substrate pads and second support substrate pads;
    a first semiconductor device comprising first pads;
    first solder connections connecting the first pads with the first support substrate pads;
    a second semiconductor device comprising second pads;
    second solder connections connecting the second pads with the second support substrate pads; and
    a frame disposed between the first and second semiconductor devices, the frame comprising a cavity.

19. The module according to claim 18, wherein the first solder connections and the second solder connections comprise pillar bumps.

20. The module according to claim 18, wherein the first solder connections and the second solder connections comprise at least one of a layer of copper/tin (Cu/Sn) alloy, a layer of tin/silver (Sn/Ag) alloy and a layer of tin/gold (Sn/Au) alloy.

21. The module according to claim 18, further comprising a molding material encapsulating the first semiconductor device, the frame and the second semiconductor device.

22. The module according to claim 18, wherein the first semiconductor device is smaller than the second semiconductor device.

23. The module according to claim 18, wherein the frame comprises an organic material or a ceramic.

* * * * *